(12) United States Patent
Erben et al.

(10) Patent No.: US 9,496,429 B1
(45) Date of Patent: Nov. 15, 2016

(54) SYSTEM AND METHOD FOR TIN PLATING METAL ELECTRODES

(71) Applicant: SolarCity Corporation, San Mateo, CA (US)

(72) Inventors: Christoph G. Erben, Los Gatos, CA (US); Zhi-Wen Sun, Sunnyvale, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/985,238

(22) Filed: Dec. 30, 2015

(51) Int. Cl.
H01L 21/00 (2006.01)
H01L 31/0224 (2006.01)

(52) U.S. Cl.
CPC ......... H01L 31/022433 (2013.01); H01L 31/022441 (2013.01)

(58) Field of Classification Search
CPC ........... H01L 31/022433; H01L 31/022441
USPC ................................................. 438/98
See application file for complete search history.

(56) References Cited

U.S. PATENT DOCUMENTS

| | | | |
|---|---|---|---|
| 819,360 | A | 3/1902 | Mayer |
| 2,938,938 | A | 5/1960 | Dickson |
| 3,094,439 | A | 6/1963 | Mann et al. |
| 3,116,171 | A | 12/1963 | Nielsen |
| 3,459,597 | A | 8/1969 | Baron |
| 3,961,997 | A | 6/1976 | Chu |
| 3,969,163 | A | 7/1976 | Wakefield |
| 4,015,280 | A | 3/1977 | Matsushita et al. |
| 4,082,568 | A | 4/1978 | Lindmayer |
| 4,124,410 | A | 11/1978 | Kotval et al. |
| 4,124,455 | A | 11/1978 | Lindmayer |
| 4,193,975 | A | 3/1980 | Kotval et al. |
| 4,200,621 | A | 4/1980 | Liaw et al. |
| 4,213,798 | A | 7/1980 | Williams et al. |
| 4,251,285 | A | 2/1981 | Yoldas |
| 4,284,490 | A | 8/1981 | Weber |
| 4,315,096 | A | 2/1982 | Tyan |
| 4,336,648 | A | 6/1982 | Pschunder et al. |
| 4,342,044 | A | 7/1982 | Ovshinsky et al. |

(Continued)

FOREIGN PATENT DOCUMENTS

| | | |
|---|---|---|
| CN | 100580957 C | 1/2010 |
| CN | 102012010151 | 1/2010 |

(Continued)

OTHER PUBLICATIONS

Machine translation of JP 10004204 A, Shindou et al.

(Continued)

*Primary Examiner* — David S Blum
(74) *Attorney, Agent, or Firm* — Shun Yao; Park, Vaughan, Fleming & Dowler LLP

(57) ABSTRACT

Systems and methods for fabricating a photovoltaic structure are provided. During fabrication, a patterned mask is formed on a first surface of a multilayer body of the photovoltaic structure, with openings of the mask corresponding to grid line locations of a first grid. Subsequently, a core layer of the first grid is deposited in the openings of the patterned mask, and a protective layer is deposited on an exposed surface of the core layer. The patterned mask is then removed to expose the sidewalls of the core layer. Heat is applied to the protective layer such that the protective layer reflows to cover both the exposed surface and sidewalls of the core layer.

11 Claims, 9 Drawing Sheets

(56) References Cited

U.S. PATENT DOCUMENTS

| | | |
|---|---|---|
| 4,431,858 A | 2/1984 | Gonzalez et al. |
| 4,514,579 A | 4/1985 | Hanak |
| 4,540,843 A | 9/1985 | Gochermann et al. |
| 4,567,642 A | 2/1986 | Dilts et al. |
| 4,571,448 A | 2/1986 | Barnett |
| 4,577,051 A | 3/1986 | Hartman |
| 4,586,988 A | 5/1986 | Nath et al. |
| 4,589,191 A | 5/1986 | Green et al. |
| 4,612,409 A | 9/1986 | Hamakawa et al. |
| 4,617,421 A | 10/1986 | Nath |
| 4,633,033 A | 12/1986 | Nath et al. |
| 4,652,693 A | 3/1987 | Bar-On |
| 4,667,060 A | 5/1987 | Spitzer |
| 4,670,096 A | 6/1987 | Schwirtlich |
| 4,694,115 A | 9/1987 | Lillington et al. |
| 4,771,017 A | 9/1988 | Tobin et al. |
| 4,784,702 A | 11/1988 | Henri |
| 4,877,460 A | 10/1989 | Flodl |
| 4,933,061 A | 6/1990 | Kulkarni |
| 5,053,355 A | 10/1991 | von Campe |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Flodl et al. |
| 5,178,685 A | 1/1993 | Borenstein |
| 5,181,968 A | 1/1993 | Nath et al. |
| 5,213,628 A | 5/1993 | Noguchi et al. |
| 5,217,539 A | 6/1993 | Fraas et al. |
| 5,279,682 A | 1/1994 | Wald et al. |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi et al. |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo et al. |
| 5,676,766 A | 10/1997 | Probst et al. |
| 5,681,402 A | 10/1997 | Ichinose et al. |
| 5,698,451 A | 12/1997 | Hanoka |
| 5,705,828 A | 1/1998 | Noguchi et al. |
| 5,726,065 A | 3/1998 | Szlufcik et al. |
| 5,808,315 A | 9/1998 | Murakami |
| 5,814,195 A | 9/1998 | Lehan et al. |
| 5,903,382 A | 5/1999 | Tench et al. |
| 5,935,345 A | 8/1999 | Kuznicki |
| 6,034,322 A | 3/2000 | Pollard |
| 6,091,019 A | 7/2000 | Sakata et al. |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan et al. |
| 6,410,843 B1 | 6/2002 | Kishi |
| 6,441,297 B1 | 8/2002 | Keller |
| 6,488,824 B1 | 12/2002 | Hollars |
| 6,538,193 B1 | 3/2003 | Fraas |
| 6,552,414 B1 | 4/2003 | Horzel et al. |
| 6,586,270 B2 | 7/2003 | Tsuzuki et al. |
| 2,626,907 A1 | 9/2003 | Chandra |
| 6,620,645 B2 | 9/2003 | Chandra et al. |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura et al. |
| 7,164,150 B2 | 1/2007 | Terakawa et al. |
| 7,328,534 B2 | 2/2008 | Dinwoodie |
| 7,388,146 B2 | 6/2008 | Fraas |
| 7,399,385 B2 | 7/2008 | German et al. |
| 7,534,632 B2 | 5/2009 | Hu et al. |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German et al. |
| 7,977,220 B2 | 7/2011 | Sanjurjo |
| 8,070,925 B2 | 12/2011 | Hoffman et al. |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause et al. |
| 8,222,513 B2 | 7/2012 | Luch |
| 8,222,516 B2 | 7/2012 | Cousins |
| 8,343,795 B2 | 1/2013 | Luo et al. |
| 8,586,857 B2 | 11/2013 | Everson |
| 8,671,630 B2 | 3/2014 | Lena |
| 2001/0008143 A1 | 7/2001 | Sasaoka et al. |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000571 A1 | 1/2003 | Wakuda |
| 2003/0034062 A1 | 2/2003 | Stern |
| 2003/0042516 A1 | 3/2003 | Forbes et al. |
| 2003/0070705 A1 | 4/2003 | Hayden et al. |
| 2003/0097447 A1 | 5/2003 | Johnston |
| 2003/0116185 A1 | 6/2003 | Oswald |
| 2003/0121228 A1 | 7/2003 | Stoehr et al. |
| 2003/0168578 A1 | 9/2003 | Taguchi et al. |
| 2003/0183270 A1 | 10/2003 | Falk et al. |
| 2003/0201007 A1 | 10/2003 | Fraas |
| 2004/0065363 A1 | 4/2004 | Fetzer et al. |
| 2004/0103937 A1 | 6/2004 | Bilyalov et al. |
| 2004/0112426 A1 | 6/2004 | Hagino |
| 2004/0123897 A1 | 7/2004 | Ojima et al. |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0012095 A1 | 1/2005 | Niira et al. |
| 2005/0022861 A1 | 2/2005 | Rose et al. |
| 2005/0061665 A1 | 3/2005 | Pavani |
| 2005/0064247 A1 | 3/2005 | Sane |
| 2005/0074954 A1 | 4/2005 | Yamanaka |
| 2005/0109388 A1 | 5/2005 | Murakami et al. |
| 2005/0133084 A1 | 6/2005 | Joge et al. |
| 2005/0178662 A1 | 8/2005 | Wurczinger |
| 2005/0189015 A1 | 9/2005 | Rohatgi et al. |
| 2005/0199279 A1 | 9/2005 | Yoshimine et al. |
| 2005/0252544 A1 | 11/2005 | Rohatgi et al. |
| 2005/0257823 A1 | 11/2005 | Zwanenburg |
| 2006/0012000 A1 | 1/2006 | Estes et al. |
| 2006/0060238 A1 | 3/2006 | Hacke et al. |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach et al. |
| 2006/0231803 A1 | 10/2006 | Wang et al. |
| 2006/0255340 A1 | 11/2006 | Manivannan et al. |
| 2006/0283496 A1 | 12/2006 | Okamoto et al. |
| 2006/0283499 A1 | 12/2006 | Terakawa et al. |
| 2007/0023081 A1 | 2/2007 | Johnson et al. |
| 2007/0023082 A1 | 2/2007 | Manivannan et al. |
| 2007/0108437 A1 | 5/2007 | Tavkhelidze |
| 2007/0110975 A1 | 5/2007 | Schneweis |
| 2007/0132034 A1 | 6/2007 | Curello et al. |
| 2007/0137699 A1 | 6/2007 | Manivannan et al. |
| 2007/0148336 A1 | 6/2007 | Bachrach et al. |
| 2007/0186968 A1 | 8/2007 | Nakauchi |
| 2007/0186970 A1 | 8/2007 | Takahashi et al. |
| 2007/0202029 A1 | 8/2007 | Burns et al. |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann et al. |
| 2007/0283997 A1 | 12/2007 | Hachtmann |

(56) References Cited

U.S. PATENT DOCUMENTS

| | | |
|---|---|---|
| 2008/0000522 A1 | 1/2008 | Johnson |
| 2008/0041437 A1 | 2/2008 | Yamaguchi |
| 2008/0047602 A1 | 2/2008 | Krasnov |
| 2008/0047604 A1 | 2/2008 | Korevaar et al. |
| 2008/0053519 A1 | 3/2008 | Pearce |
| 2008/0061293 A1 | 3/2008 | Ribeyron |
| 2008/0092947 A1 | 4/2008 | Lopatin et al. |
| 2008/0121272 A1 | 5/2008 | Besser et al. |
| 2008/0121276 A1 | 5/2008 | Lopatin et al. |
| 2008/0121932 A1 | 5/2008 | Ranade |
| 2008/0128013 A1 | 6/2008 | Lopatin |
| 2008/0149161 A1 | 6/2008 | Nishida et al. |
| 2008/0156370 A1 | 7/2008 | Abdallah et al. |
| 2008/0173350 A1 | 7/2008 | Choi et al. |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness et al. |
| 2008/0230122 A1 | 9/2008 | Terakawa |
| 2008/0251117 A1 | 10/2008 | Schubert et al. |
| 2008/0264477 A1 | 10/2008 | Moslehi |
| 2008/0276983 A1 | 11/2008 | Drake et al. |
| 2008/0283115 A1 | 11/2008 | Fukawa et al. |
| 2008/0302030 A1 | 12/2008 | Stancel et al. |
| 2008/0303503 A1 | 12/2008 | Wolfs |
| 2008/0308145 A1 | 12/2008 | Krasnov et al. |
| 2009/0007965 A1 | 1/2009 | Rohatgi et al. |
| 2009/0056805 A1 | 3/2009 | Barnett |
| 2009/0078318 A1 | 3/2009 | Meyers et al. |
| 2009/0084439 A1 | 4/2009 | Lu et al. |
| 2009/0101872 A1 | 4/2009 | Young et al. |
| 2009/0139512 A1 | 6/2009 | Lima |
| 2009/0151783 A1 | 6/2009 | Lu et al. |
| 2009/0155028 A1 | 6/2009 | Boguslavskiy |
| 2009/0160259 A1 | 6/2009 | Naiknaware et al. |
| 2009/0188561 A1 | 7/2009 | Aiken et al. |
| 2009/0221111 A1 | 9/2009 | Frolov et al. |
| 2009/0229854 A1 | 9/2009 | Fredenberg |
| 2009/0239331 A1 | 9/2009 | Xu et al. |
| 2009/0250108 A1 | 10/2009 | Zhou et al. |
| 2009/0255574 A1 | 10/2009 | Yu et al. |
| 2009/0283138 A1 | 11/2009 | Lin et al. |
| 2009/0283145 A1 | 11/2009 | Kim et al. |
| 2009/0293948 A1 | 12/2009 | Tucci et al. |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman et al. |
| 2010/0043863 A1 | 2/2010 | Wudu |
| 2010/0065111 A1 | 3/2010 | Fu et al. |
| 2010/0068890 A1 | 3/2010 | Stockum et al. |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu et al. |
| 2010/0132774 A1 | 6/2010 | Borden |
| 2010/0132792 A1 | 6/2010 | Kim et al. |
| 2010/0147364 A1 | 6/2010 | Gonzalez |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch et al. |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Yu |
| 2010/0300507 A1 | 12/2010 | Heng et al. |
| 2010/0313877 A1 | 12/2010 | Bellman |
| 2010/0326518 A1 | 12/2010 | Juso |
| 2011/0073175 A1 | 3/2011 | Hilali |
| 2011/0146781 A1 | 6/2011 | Laudisio et al. |
| 2011/0156188 A1 | 6/2011 | Tu |
| 2011/0168250 A1 | 7/2011 | Lin et al. |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch et al. |
| 2012/0000502 A1 | 1/2012 | Wiedeman |
| 2012/0012174 A1 | 1/2012 | Wu |
| 2012/0028461 A1 | 2/2012 | Ritchie et al. |
| 2012/0031480 A1 | 2/2012 | Tisler |
| 2012/0040487 A1 | 2/2012 | Asthana |
| 2012/0073975 A1 | 3/2012 | Ganti |
| 2012/0085384 A1 | 4/2012 | Heng |
| 2012/0125391 A1 | 5/2012 | Pinarbasi |
| 2012/0145233 A1 | 6/2012 | Syn |
| 2012/0152349 A1 | 6/2012 | Cao |
| 2012/0192932 A1 | 8/2012 | Wu et al. |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng et al. |
| 2012/0325282 A1 | 12/2012 | Snow |
| 2013/0000705 A1 | 1/2013 | Shappir |
| 2013/0014802 A1 | 1/2013 | Zimmerman |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0206213 A1 | 8/2013 | He |
| 2013/0206221 A1 | 8/2013 | Gannon |
| 2013/0213469 A1* | 8/2013 | Kramer ........... H01L 31/022458 136/256 |
| 2013/0220401 A1 | 8/2013 | Scheulov |
| 2013/0228221 A1* | 9/2013 | Moslehi .......... H01L 31/022441 136/256 |
| 2013/0247955 A1 | 9/2013 | Baba |
| 2013/0269771 A1 | 10/2013 | Cheun |
| 2014/0000682 A1 | 1/2014 | Zhao |
| 2014/0066265 A1 | 3/2014 | Oliver |
| 2014/0124013 A1 | 5/2014 | Morad et al. |
| 2014/0124014 A1 | 5/2014 | Morad et al. |
| 2014/0154836 A1 | 6/2014 | Kim |
| 2014/0196768 A1* | 7/2014 | Heng ................. H01L 31/0504 136/251 |
| 2014/0318611 A1* | 10/2014 | Moslehi .......... H01L 31/022441 136/256 |
| 2014/0345674 A1 | 11/2014 | Yang et al. |
| 2015/0020877 A1* | 1/2015 | Moslehi .......... H01L 31/022441 136/256 |
| 2015/0171230 A1* | 6/2015 | Kapur ............. H01L 31/022441 438/72 |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |

(56) References Cited

U.S. PATENT DOCUMENTS

| | | |
|---|---|---|
| 2015/0349702 A1 | 12/2015 | Morad |
| 2015/0349703 A1 | 12/2015 | Morad |

FOREIGN PATENT DOCUMENTS

| | | |
|---|---|---|
| CN | 2626907 A1 | 3/2015 |
| CN | 104409402 | 3/2015 |
| DE | 4030713 | 4/1992 |
| DE | 202007002897 | 8/2008 |
| DE | H04245683 A | 11/2013 |
| EP | 1770791 | 4/2007 |
| EP | 1816684 | 8/2007 |
| EP | 2071635 | 6/2009 |
| EP | 2362430 | 8/2011 |
| EP | 2002057357 A | 11/2011 |
| EP | 2011123646 A2 | 7/2012 |
| EP | 2479796 A1 | 8/2013 |
| EP | 2479796 | 7/2015 |
| EP | 2626907 | 8/2015 |
| JP | 2011008881 A2 | 9/1992 |
| JP | 2385561 A2 | 9/1995 |
| JP | H07249788 A | 9/1995 |
| JP | 10004204 | 1/1998 |
| JP | H1131834 | 2/1999 |
| JP | 2010085949 | 2/2002 |
| JP | 20050122721 A | 6/2005 |
| JP | 2009177225 | 8/2009 |
| KR | 2003083953 A1 | 12/2005 |
| KR | 2005159312 A | 1/2006 |
| KR | 2006003277 A | 1/2006 |
| KR | 2006097189 A1 | 2/2009 |
| KR | 20090011519 A | 2/2009 |
| WO | 9117839 | 11/1991 |
| WO | 9120097 A1 | 11/1991 |
| WO | 2011005447 A2 | 12/1991 |
| WO | 2008089657 | 7/2008 |
| WO | 2009150654 | 12/2009 |
| WO | 2009150654 A2 | 7/2010 |
| WO | 2010075606 A1 | 9/2010 |
| WO | 2010104726 A2 | 1/2011 |
| WO | 2010123974 A1 | 1/2011 |
| WO | 2011005447 | 1/2011 |
| WO | 2011008881 | 1/2011 |
| WO | 2011053006 | 5/2011 |
| WO | 2013020590 A1 | 2/2013 |
| WO | 2014074826 | 5/2014 |
| WO | 2014110520 | 7/2014 |

OTHER PUBLICATIONS

Hornbachner et al., "Cambered Photovoltaic Module and Method for its Manufacture" Jun. 17, 2009.
Chabal, Yves J. et al., 'Silicon Surface and Interface Issues for Nanoelectronics,' The Electrochemical Society Interface, Spring 2005, pp. 31-33.
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.
Davies, P.C.W., 'Quantum tunneling time,' Am. J. Phys. 73, Jan. 2005, pp. 23-27.
Green, Martin A. et al., 'High-Efficiency Silicon Solar Cells,' IEEE Transactions on Electron Devices, vol. ED-31, No. 5, May 1984, pp. 679-683.
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
Yao Wen-Jie et al: 'Interdisciplinary Physics and Related Areas of Science and Technology; The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
WP Leroy et al., "In Search for the Limits of Rotating Cylindrical Magnetron Sputtering", Magnetron, ION Processing and ARC Technologies European Conference, Jun. 18, 2010, pp. 1-32.
Beaucarne G et al: 'Epitaxial thin-film Si solar cells' Thin Solid Films, Elsevier-Sequoia S.A. Lausanne, CH LNKD—DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].
Collins English Dictionary (Convex. (2000). In Collins English Dictionary. http://search.credoreference.com/content/entry/hcengdict/convex/0 on Oct. 18, 2014).
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.
JCS Pires, J Otubo, AFB Braga, PR Mei; The purification of metallurgical grade silicon by electron beam melting, J of Mats Process Tech 169 (2005) 16-20.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Mueller, Thomas, et al. "High quality passivation for heteroj unction solar cells by hydrogenated amorphous silicon suboxide films." Applied Physics Letters 92.3 (2008): 033504-033504.
Munzer, K.A. "High Throughput Industrial In-Line Boron BSF Diffusion" Jun. 2005. 20th European Photovoltaic Solar Energy Conference, pp. 777-780.
National Weather Service Weather Forecast Office ("Why Do We have Seasons?" http://www.crh.noaa.gov/lmk/?n=seasons Accessed Oct. 18, 2014).
O'Mara, W.C.; Herring, R.B.; Hunt L.P. (1990). Handbook of Semiconductor Silicon Technology. William Andrew Publishing/Noyes. pp. 275-293.
Stangl et al., Amorphous/Crystalline Silicon heterojunction solar cells—a simulation study; 17th European Photovoltaic Conference, Munich, Oct. 2001.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Parthavi, "Doping by Diffusion and Implantation", <http://www.leb.eei.uni-erlangen.de/winterakademie/2010/report/course03/pdf/0306.pdf>.
Weiss, "Development of different copper seed layers with respect to the copper electroplating process," Microelectronic Engineering 50 (2000) 443-440, Mar. 15, 2000.
Tomasi, "Back-contacted Silicon Heterojunction Solar Cells With Efficiency>21%" 2014 IEEE.

* cited by examiner

SYSTEM AND METHOD FOR TIN PLATING METAL ELECTRODES

FIELD OF THE INVENTION

This is related to fabrication of photovoltaic structures, including fabrication of photovoltaic structures with tin-plated metallic electrodes.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

BACKGROUND

The negative environmental impact of fossil fuels and their rising cost have resulted in a need for cleaner, cheaper alternative energy sources. Among different forms of alternative energy sources, solar power has been favored for its cleanness and wide availability.

A solar cell converts light into electricity using the photovoltaic effect. Most solar cells include one or more p-n junctions, which can include heterojunctions or homojunctions. In a solar cell, light is absorbed near the p-n junction and generates carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit. High efficiency solar cells are essential in reducing the cost to produce solar energy.

One important factor affecting the energy-conversion efficiency of a solar cell is its internal resistance. Reducing resistive loss can increase the energy outputted by the solar cell, and hence the solar cell's efficiency. It has been shown that electrode grids based on electroplated Cu have significantly lower resistivity than conventional screen-printed Ag grids. In addition to having lower resistivity, electroplated Cu grids also cost less than the Ag grids. However, unlike Ag, Cu can be susceptible to oxidation and corrosion. When exposed to moisture, Cu grids may oxidize, resulting in increased resistivity and decreased strength. Therefore, Cu grids of solar cells are often coated with a corrosion-resistive protection layer. Conventional approaches for coating Cu grids with such a corrosion-resistive protection layer can generate hazardous waste.

SUMMARY

One embodiment of the invention can provide a system for fabricating a photovoltaic structure. During fabrication, the system can form a multilayer body of the photovoltaic structure and a first grid on a first surface of the multilayer body. While forming the first grid, the system can form a patterned mask on the first surface of the multilayer body, with openings of the patterned mask corresponding to grid line locations of the first grid. The system can further deposit, using a plating technique, a core layer of the first grid in the openings of the patterned mask; deposit, using a plating technique, a protective layer on an exposed surface of the core layer while the patterned mask covering sidewalls of the core layer; remove the patterned mask to expose the sidewalls of the core layer; and apply heat to the protective layer such that the protective layer reflows to cover both the exposed surface and sidewalls of the core layer.

In one embodiment, the patterned mask can include a photoresist mask or a $SiO_2$ mask.

In one embodiment, the core layer can be a metallic layer that includes Cu.

The thickness of the core layer can be between 10 and 100 microns, for example.

The protective layer can be a metallic layer that includes one or more of: tin, tin-lead alloy, tin-zinc alloy, tin-bismuth alloy, tin-indium alloy, tin-silver-copper alloy, tin-lead-zinc alloy, and tin-lead-copper alloy.

In a further variation, the protective layer can be a metallic layer that includes one or more of: tin and tin-lead alloy.

The thickness of the protective layer, before the protective layer reflows, can be between 1 and 10 microns, for example.

The thickness of the protective layer, after the protective layer reflows, can be between 0.1 and 2 microns, for example.

The multilayer body can include, for example, at least a base layer, an emitter layer positioned on a first side of the base layer, and a surface field layer positioned on a second side of the base layer.

In a further variation, the multilayer body can further include at least one of: a passivation layer positioned between the base layer and the emitter layer, a second passivation layer positioned between the base layer and the surface field layer, a transparent conductive oxide layer positioned on the emitter layer, and a second transparent conductive oxide layer positioned on the surface field layer.

In a variation of this embodiment, the system can further form a second grid on a second surface of the multilayer body, which may be formed simultaneously with the first grid.

The above described embodiments and their variations can be combined in any suitable manner.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Systems and methods for fabricating low-cost high-efficiency photovoltaic structures are provided. To ensure high-efficiency and to reduce fabrication cost, a photovoltaic structure can use electroplated Cu grids as electrodes on one or both surfaces. Because Cu is susceptible to oxidation and corrosion, it can be desirable to coat the Cu grid, including both its top surface and sidewalls, with a protective layer. Tin, due to its anti-corrosion property and low melting point, is often used to provide corrosion protection and solderbility (if needed) to electroplated Cu grids. In some embodiments, depositing a tin layer over a Cu grid can be achieved via a tin plating process followed by the thermal reflow of the tin layer. More specifically, during fabrication, a thick tin-containing metallic layer can be plated onto the top surface of an electroplated Cu grid while the sidewalls of the Cu grid are still covered by the plating mask (e.g., a photoresist or $SiO_2$ mask). Subsequently, the plating mask can be removed to expose the sidewalls of the Cu grid, and the tin-containing metallic layer can then be heated, causing the tin-containing metal to reflow. As a result, the sidewalls of the Cu grid can now be covered by a tin-containing metallic layer. Compared to the conventional tin-immersion technique that generates toxic waste, this novel fabrication process is advantageous, because it is environmental friendly and can reduce fabrication cost.

Fabrication Processes

Figure 1A:
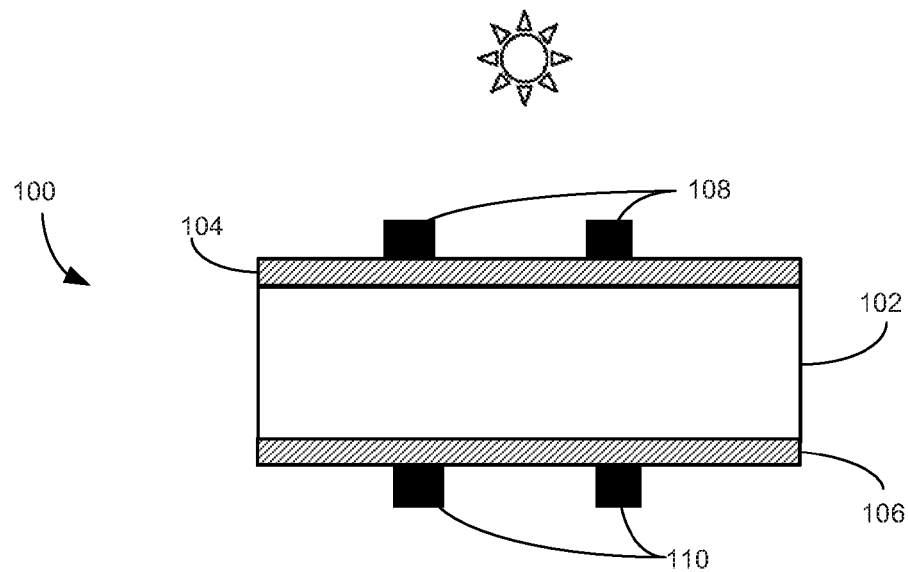
FIG. 1A shows an exemplary high-efficiency photovoltaic structure.

FIG. 1A shows an exemplary high-efficiency photovoltaic structure. Photovoltaic structure 100 can include substrate 102, surface-field layer 104, emitter layer 106, and electrode grids 108 and 110. In the example shown in FIG. 1A, substrate 102 can include a lightly doped or substantially intrinsic crystalline Si (c-Si) layer; surface-field layer 104 can include a heavily doped amorphous Si (a-Si) layer; and emitter layer 106 can include a heavily doped a-Si layer.

Surface-field layer 104 can face the majority of incident light (as indicated by the sun), and hence can also be called the front surface-field (FSF) layer. Substrate 102 can either be doped with n-type dopants (e.g., phosphorus) or p-type dopants (e.g., boron). The doping types of FSF layer 104 and emitter layer 106 can be determined by the doping type of substrate 102. For an n-type doped substrate, FSF layer 104 can be doped with n-type dopants to act as an electron collector; and emitter layer 106 can be doped with p-type dopants to act as a hole collector. On the other hand, for a p-type doped substrate, FSF layer 104 can be doped with p-type dopants to act as a hole collector; and emitter layer 106 can be doped with n-type dopants to act as an electron collector.

Figure 1B:
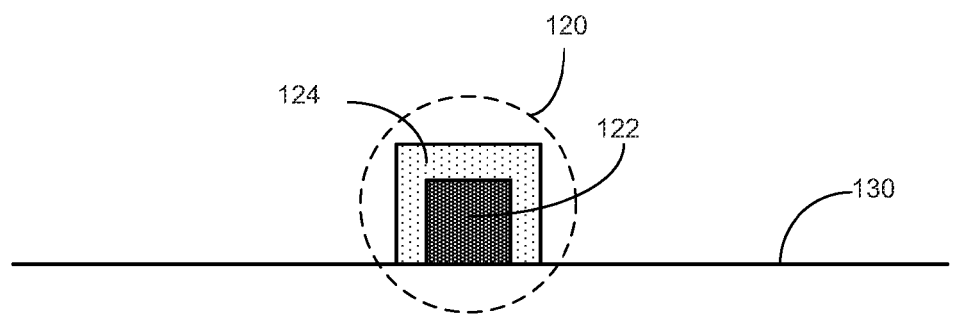
FIG. 1B shows an amplified view of a metal line on a surface of a photovoltaic structure.

Electrode grids 108 and 110 are responsible for collecting current. To ensure low electrical resistivity while resisting oxidation and corrosion, electrode grids 108 and 110 can include an electroplated Cu core and a protective layer covering the top surface and sidewalls of the Cu core. FIG. 1B shows an amplified view of a grid line on a surface of a photovoltaic structure. Grid line 120 (e.g., a finger line or a busbar) can be positioned on surface 130 of a photovoltaic structure. Grid line 120 can include core layer 122 and protective layer 124. If the shape of the prism is substantially rectangular (as shown in FIG. 1B), core layer 122 can have a top surface, a bottom surface, and four sidewalls. The bottom surface can be in contact with surface 130 of the photovoltaic structure, and the top surface and sidewalls covered by protective layer 124. Protective layer 124 typically can contain metallic materials that can resist corrosion, such as Ag and Sn (tin), or non-metallic materials, such as certain corrosion-resisting organic materials. Tin sometimes can be preferred over Ag due to its lower cost and soldering ability.

Conventional approaches for depositing protective layer 124 often involves a metal immersion process, during which Ag or Sn ions displace Cu ions on the top surface and sidewalls of Cu core 122. During the immersion-tin process, a complexing agent, such as thiourea ($SC(NH_2)_2$) and its derivatives, is needed, because the redox potential of Cu is greater than that of Sn. More specifically, Thiourea can reduce the redox potential of Cu from +0.34 V to −0.39 V, which is lower than the redox potential of Sn (−0.14 V), making it possible for Sn ions to replace the Cu ions.

However, this immersion-tin approach faces a significant challenge. More specifically, thiourea is a hazardous material (e.g., it is suspected to be a carcinogen) and needs to be handled with care. Not only does the working environment need to be carefully controlled to prevent possible human exposure, the waste solution generated by the emersion-tin process also needs to be carefully treated. The treatment of the thiourea-containing waste can be an expensive process, which can then add to the fabrication cost of the solar panels.

To reduce fabrication cost, embodiments of the present invention can deposit a protective layer over the electroplated Cu grid without using thiourea. Instead of using an immersion process that relies on displacement of metal ions, a plating-followed-by-thermal-reflow process can be used to form a protective layer surrounding the electroplated Cu finger lines or busbars.

Figure 2A:
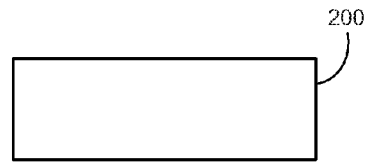
FIGS. 2A-2O show exemplary intermediate photovoltaic structures after certain fabrication steps, according to an embodiment of the present invention.
Figure 2E:
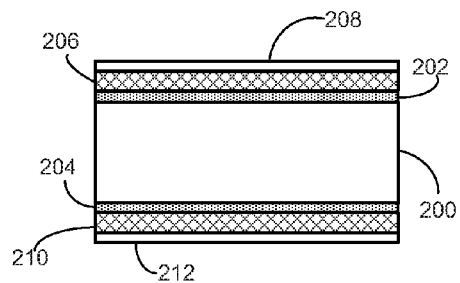
Figure 2B:
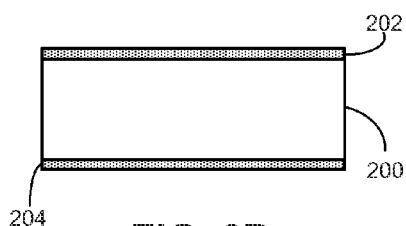
Figure 2F:
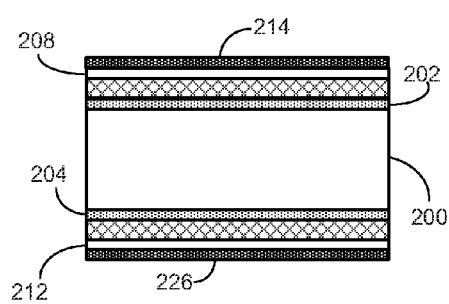
Figure 2C:
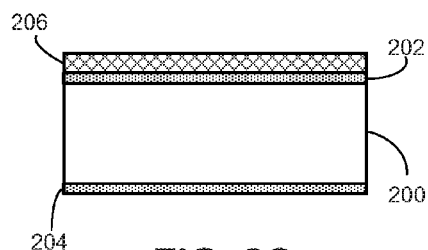
Figure 2D:
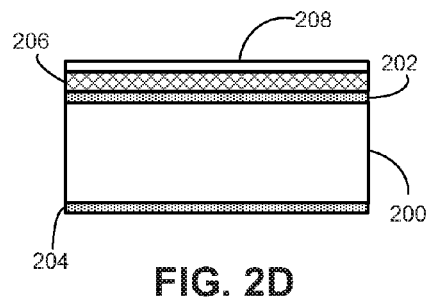
Figure 2G:
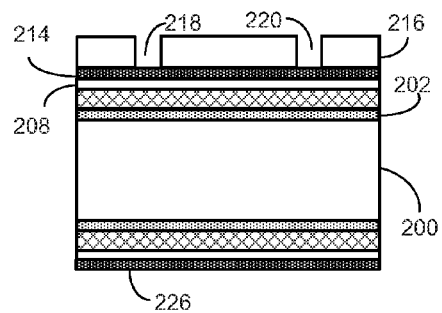
Figure 2H:
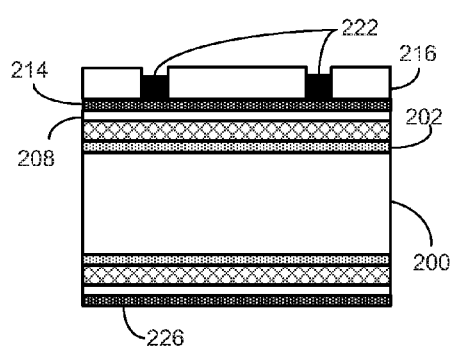
Figure 2J:
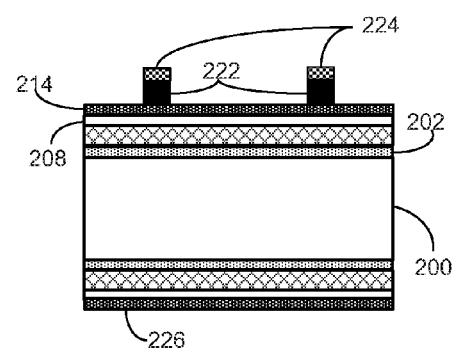
Figure 2I:
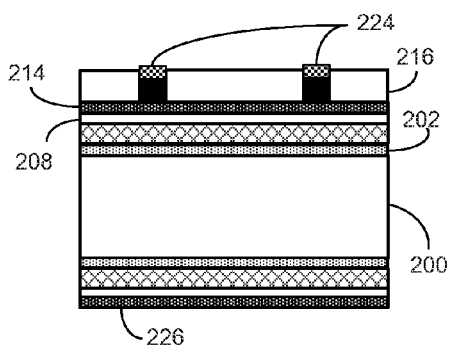
Figure 2K:
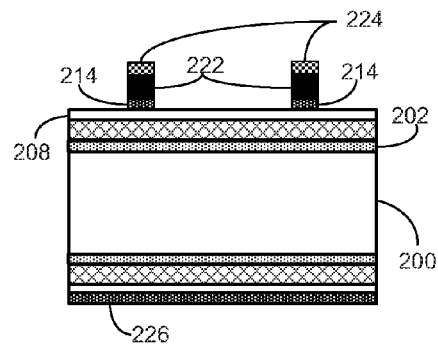
Figure 2L:
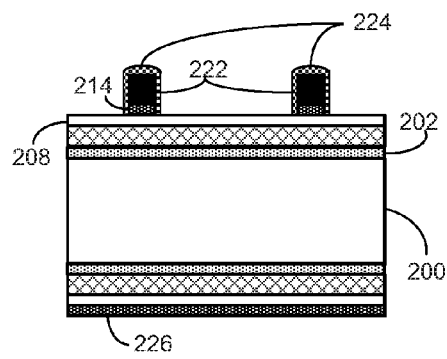
Figure 2N:
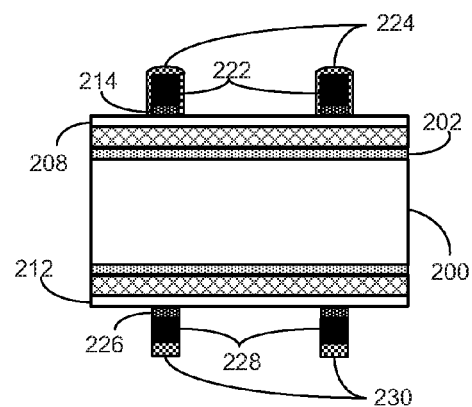
Figure 2M:
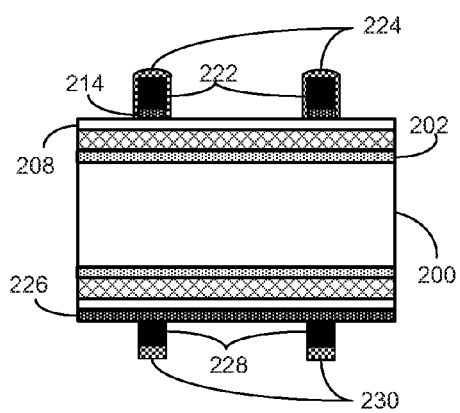
Figure 2O:
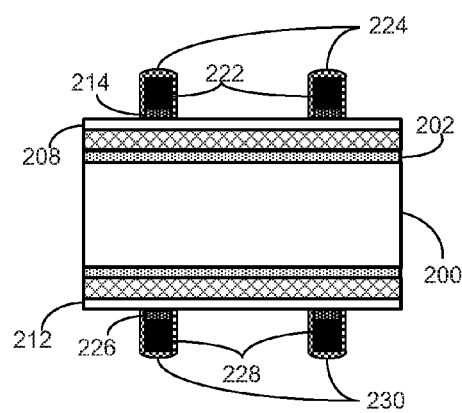

FIGS. 2A-2O show exemplary intermediate photovoltaic structures after certain fabrication steps, according to an embodiment of the present invention. FIG. 2A shows substrate 200. In some embodiments, substrate 200 can include a solar grade Si (SG-Si) wafer, which can be epitaxially grown or prepared using a Czochralski (CZ) or Float Zone (FZ) method. The thickness of substrate 200 can be between 80 and 300 microns, and typically between 110 and 180 microns. The resistivity of the SG-Si wafer can range from 0.5 ohm-cm to 10 ohm-cm, for example. Substrate 200 can be intrinsic or lightly doped with n- or p-type dopants. In some embodiments, substrate 200 can be doped with n-type dopants and can have a doping concentration ranging from $1 \times 10^{10}/cm^3$ to $1 \times 10^{16}/cm^3$. In further embodiments, substrate 200 can have a graded doping profile. The preparation operation can include typical saw damage etching that removes approximately 10 µm of silicon and, optionally, surface texturing. The surface texture can have various patterns, including but not limited to: hexagonal-pyramid, inverted pyramid, cylinder, cone, ring, and other irregular shapes. In one embodiment, the surface-texturing operation can result in a random pyramid textured surface. Afterwards, substrate 200 can go through extensive surface cleaning.

FIG. 2B shows that a tunneling/passivation layer can be formed on both surfaces of Si substrate 200 to form tunneling/passivation layers 202 and 204, respectively. A tunneling/passivation layer can include a single layer or a multi-layer structure. In some embodiments, a tunneling/passivation multilayer structure can include a tunneling layer and one or more passivation layers. In further embodiments, the tunneling layer can include a thin oxide layer, and the passivation layer(s) can include wide bandgap materials, such as intrinsic hydrogenated amorphous Si (a-Si:H). Various oxidation techniques can be used to form the thin oxide layer, including, but not limited to: wet oxidation using oxygen or ozone bubbling at low temperatures, dry oxidation at relatively high temperatures (around or below 400° C.) (also known as thermal oxidation), low-pressure radical oxidation, atomic layer deposition (ALD) of a $SiO_2$ layer, plasma-enhanced chemical-vapor deposition (PECVD) of a $SiO_2$ layer, etc. The thin oxide layer can also include native oxide. The thickness of the thin oxide layer can be between 1 and 50 angstroms, preferably between 1 and 10 angstroms. In some embodiments, the tunneling layer can also function as a passivation layer, and no additional passivation layer is needed.

The intrinsic a-Si:H passivation layer can be formed using a chemical-vapor deposition (CVD) technique, such as PECVD. To ensure superior passivation results and a low interface defect density ($D_{it}$), the intrinsic a-Si:H passivation layer may have graded H content levels. At the interface to the tunneling layer or substrate 200, the intrinsic a-Si:H passivation layer can have a low H content level to ensure a low $D_{it}$, whereas other portions of the intrinsic a-Si:H passivation layer can have a higher H content level to provide a wider bandgap, and hence better passivation effects. Forming an intrinsic a-Si:H layer having graded H content levels can involve adjusting the H flow rate during the CVD process.

FIG. 2C shows that emitter layer 206 can be deposited on tunneling/passivation layer 202. The doping type of emitter layer 206 can be opposite to that of substrate 200. For n-type doped substrate, emitter layer 206 can be p-type doped. Emitter layer 206 can include doped a-Si or hydrogenated a-Si (a-Si:H). The thickness of emitter layer 206 can be between 2 and 50 nm, preferably between 4 and 8 nm. In some embodiments, emitter layer 206 can have a graded doping profile. The doping profile of emitter layer 206 can be optimized to ensure good ohmic contact, minimum light absorption, and a large built-in electrical field. In some embodiments, the doping concentration of emitter layer 206 can range from $1 \times 10^{15}/cm^3$ to $5 \times 10^{20}/cm^3$. In further embodiments, the region within emitter layer 206 that is adjacent to tunneling/passivation layer 202 can have a lower doping concentration, and the region that is away from tunneling/passivation layer 202 can have a higher doping concentration. The lower doping concentration at the interface between tunneling/passivation layer 202 and emitter layer 206 can ensure a reduced interface defect density, and the higher doping concentration on the other side can prevent emitter layer depletion.

The crystal structure of emitter layer 206 can either be nanocrystalline, which can enable higher carrier mobility; or protocrystalline, which can enable good absorption in the ultra-violet (UV) wavelength range and good transmission in the infrared (IR) wavelength range. Both crystalline structures need to preserve the large bandgap of the a-Si. For higher film conductivity and better moisture barrier performance, the finishing surface of emitter layer 206 (the surface away from tunneling/passivation layer 202) should have a nanocrystalline structure. Various deposition techniques can be used to deposit emitter layer 206, including, but not limited to: atomic layer deposition, PECVD, hot wire CVD, etc. In some embodiments, depositions of an intrinsic a-Si:H passivation layer and emitter layer 206 can be performed within the same CVD environment.

FIG. 2D shows that TCO layer 208 can be deposited on emitter layer 206 using a physical vapor deposition (PVD) process, such as sputtering or evaporation. Materials used to form TCO layer 208 can include, but are not limited to: tungsten doped indium oxide (IWO), indium-tin-oxide (ITO), GaInO (GIO), GaInSnO (GITO), ZnInO (ZIO), ZnInSnO (ZITO), tin-oxide ($SnO_x$), aluminum doped zinc-oxide (ZnO:Al or AZO), gallium doped zinc-oxide (ZnO:Ga), and their combinations. If emitter layer 206 is p-type doped, TCO layer 208 can have a relatively high work function (e.g., between 5 and 6 eV) to ensure that the work function of TCO layer 208 matches that of p-type doped a-Si. Examples of high work function TCO can include, but are not limited to: GaInO (GIO), GaInSnO (GITO), ZnInO (ZIO), ZnInSnO (ZITO), their combinations, as well as their combination with ITO.

In FIG. 2E, a layer stack that includes surface field layer 210 and TCO layer 212 can be formed on the surface of tunneling/passivation layer 204. Surface field layer 210 can have the same doping type as that of substrate 200. For an n-type doped substrate, surface field layer 210 can also be n-type doped. Other than the conductive doping type, surface field layer 210 can be similar to emitter layer 206 by having similar material make up, thickness, doping profile, and crystal structure. For example, like emitter layer 206, surface field layer 210 can include doped a-Si or a-Si:H, and can have a thickness between 2 and 50 nm, preferably between 4 and 8 nm. Alternatively, surface field layer 210 can also include crystalline Si (c-Si). In some embodiments, the doping concentration of surface field layer 210 can range from $1 \times 10^{15}/cm^3$ to $5 \times 10^{20}/cm^3$. The doping profile of surface field layer 210 can also be similar to that of emitter layer 206. Various deposition techniques can be used to deposit surface field layer 210, including, but not limited to: atomic layer deposition, PECVD, hot wire CVD, etc. In some embodiments, depositions of an intrinsic a-Si:H passivation layer and surface field layer 210 can be performed within the same CVD environment.

TCO layer 212 can be deposited on surface field layer 210 using a physical vapor deposition (PVD) process, such as sputtering or evaporation. Materials used to form TCO layer 212 can include, but are not limited to: tungsten doped indium oxide (IWO), indium-tin-oxide (ITO), GaInO (GIO), GaInSnO (GITO), ZnInO (ZIO), ZnInSnO (ZITO), tin-oxide ($SnO_x$), aluminum doped zinc-oxide (ZnO:Al or AZO), gallium doped zinc-oxide (ZnO:Ga), and their combinations. If surface field layer 210 is n-type doped, TCO layer 212 can have a relatively low work function (e.g., less than 4 eV). Examples of low work function TCO materials include, but are not limited to: AZO, IWO, ITO, $F:SnO_2$, IZO, IZWO, and their combinations.

FIG. 2F shows that thin metallic layers 214 and 226 can be deposited onto TCO layers 208 and 212, respectively. Thin metallic layers 214 and 226 can be deposited using a physical vapor deposition (PVD) technique, such as sputtering deposition or evaporation. Thin metallic layers 214 and 226 can be a single layer that includes Cu, Ni, Ag, NiV, Ti, Ta, W, TiN, TaN, WN, TiW, NiCr, and their combinations. In some embodiments, thin metallic layers 214 and 226 can also be a metallic stack that includes a layer of one or more of the aforementioned metals directly deposited on the TCO layer and/or a metallic seed layer having the same material makeup (e.g., Cu) as that of the subsequently electroplated metallic grid. The thickness of thin metallic layers 214 and 226 can be between 20 nm and 500 nm. Thin metallic layers 214 and 226 can improve the adhesion between TCO layer 208 and an electroplated metallic grid. In some embodiments, thin metallic layers 214 and 226 can be deposited using separate PVD processes. Alternatively, thin metallic layers 214 and 226 can be deposited using a single PVD process.

FIG. 2G shows that a patterned mask 216 can be formed on top of thin metallic layer 214. Windows (or openings) within mask 216 (e.g., windows 218 and 220) correspond to the locations of the designed metallic grid. Patterned mask 216 can include a patterned photoresist layer, which can be formed using a photolithography technique. In one embodiment, patterning the photoresist can start with screen-printing photoresist on top of metallic layer 214, covering the entire wafer surface. The photoresist can then be baked to remove solvent. An optical mask can be laid on the photoresist, and the wafer can be exposed to UV light. After the UV exposure, the optical mask can removed, and the photoresist can be developed in a photoresist developer. Windows 218 and 220 can be formed after the photoresist is developed. In addition to printing, the photoresist can also be applied onto thin metallic layer 214 by spraying, dip coating, or curtain coating. Dry film resist can also be used.

Alternatively, patterned mask 216 can include a patterned layer of silicon oxide ($SiO_2$). In one embodiment, a patterned $SiO_2$ mask can be formed by first depositing a layer of $SiO_2$ using a low-temperature PECVD process. In a further embodiment, a patterned $SiO_2$ mask can be formed by dip-coating the surface of a wafer using silica slurry, followed by screen-printing an etchant that includes hydrofluoric acid or fluorides. Other materials (e.g., $SiN_x$) can also be possible to form patterned mask 216, as long as the masking material is electrically insulating. In some embodiments, patterned mask 216 can have a thickness of tens of microns (e.g., between 20 and 100 microns), and windows 218 and 220 can have a width between 10 and 3000 microns. If a window is used to define a finger line, its width can be between 20 and 80 microns; and if a window is used to define a busbar, its width can be between 500 and 3000 microns.

FIG. 2H shows that metallic or non-metallic materials can be deposited into the windows of patterned mask 216 to form core layer 222. If core layer 222 includes metallic materials (e.g., Cu), it can be formed using a plating technique, which can include electroplating and/or electroless plating. In some embodiments, the photovoltaic structure, including thin metallic layer 214 and patterned mask 216, can be submerged in an electrolyte solution that permits the flow of electricity. During plating, thin metallic layer 214 can be coupled to the cathode of the plating power supply, and the anode of the plating power supply can include a metallic target (e.g., a Cu target). Because mask 216 is electrically insulating and the windows within mask 216 are electrically conductive, metallic ions will be selectively deposited into the windows in mask 216, forming a metallic grid with a designed pattern. To deposit a Cu grid, a Cu plate or a basket of copper chunks can be used as the anode, and the photovoltaic structure can be submerged in an electrolyte suitable for Cu plating (e.g., a $CuSO_4$ solution). To prevent plating on the other side of the photovoltaic structure, a layer of insulating material (e.g., photoresist) can be used to cover the surface of thin metallic layer 226. To ensure a well-defined aspect ratio, it is desirable to have the thickness of mask 216 to be greater than or equal to the desired thickness of metallic core layer 222. In some embodiments, the thickness of metallic core layer 222 can between 10 and 100 microns, preferably between 30 and 50 microns. Note that, high aspect-ratios grid lines are important to obtain low-resistance electrodes while reducing shading loss.

FIG. 2I shows that additional materials can be deposited on top of core layer 222 to form protective layer 224, while patterned mask 216 remains intact. Materials used to form protective layer 224 can include materials that are corrosion resistive and have a relatively low melting point. It is preferable to use metallic materials with a melting point lower than 250° C. to preserve the electronic quality of the a-Si:H emitter and surface field layers. Tin, due to its low melting point (around 230° C.) and its anti-corrosion ability, can often be used to form protective layer 224. Other materials, including but not limited to: tin-lead alloy, tin-zinc alloy, tin-bismuth alloy, tin-indium alloy, silver-lead alloy, tin-silver-copper alloy, tin-lead-zinc alloy, tin-lead-copper alloy, etc., can also be used to form protective layer 224. In some embodiments, metallic protective layer 224 can be formed using a plating process similar to the one used to form metallic core layer 222.

Because patterned mask 216 is largely electrically insulating, during plating, metallic ions forming metallic protective layer 224 can only attach to metallic core layer 222, covering its top surface. The thickness of the plated metallic protective layer 224 can be between 0.3 and 10 microns, preferably between 3 and 7 microns, more preferably around 5 microns. A sufficient amount of protective material needs to be deposited here in order to provide, at a later time, sufficient coverage to the sidewalls of the core layer.

FIG. 2J shows that patterned mask 216 can be removed. If mask 216 includes photoresist, a photoresist stripper can be used to strip off photoresist mask 216. If mask 216 includes $SiO_2$, hydrofluoric acid or buffered hydrofluoric acid can be used to etch off $SiO_2$ mask 216. Note that, after mask 216 is removed, sidewalls of metallic core layer 222 are exposed.

FIG. 2K shows that, using metallic protective layer 224 as a mask, thin metallic layer 214 can be selectively etched to expose the underneath TCO layer 208, making it possible for light to reach the junctions. Etching thin metallic layer 224 can be optional if thin metallic layer 214 is extremely thin to be transparent.

FIG. 2L shows that heat can be applied to the photovoltaic structure to cause protective layer 224 to reflow. More specifically, heat can be applied to protective layer 224, raising its temperature to a predetermined value such that protective layer 224 reflows (i.e., it melts and starts to flow). As a result of the thermal reflow, protective layer 224 can now cover both the top surface and sidewalls of core layer 222. Protective layer 224 can also cover sidewalls of thin metallic layer 214, preventing thin metallic layer 214 from being exposed to the environment.

Various heating techniques can be used to generate the thermal reflow, including but not limited to: placing the photovoltaic structure into an oven, placing the photovoltaic structure onto a hot plate, using an infrared lamp, blowing hot air, etc. In some embodiments, the heating device can include a conveyor system to allow a larger number of wafers to be processed inline. For example, a conveyor can carry wafers through a heated tunnel, and thermal reflow of protective layer 224 can occur while the wafers passing through the heated tunnel. The temperature of the environment can be carefully controlled to ensure the reflow of protective layer 224 without causing damage to other layers. Similarly, the thermal profile (e.g., the temperature rising/cooling rate) also needs to be well controlled to reduce thermal stress. For example, the temperature can be controlled to ramp up slowly to a predetermined value that is above the melting point of protective layer 224. The predetermined temperature can be 10 to 20° C. higher than the melting point. Once melted, due to surface tension, protective layer 224 can wet the underneath core layer 222, covering its sidewalls. The time duration that protective layer 224 remains above its melting point can be referred to as the wetting time and can depend on the time it takes for protective layer 224 to completely wet the sidewalls of metallic core layer 222. If the wetting time is kept too short, the sidewalls of metallic core layer 22 may not be sufficiently covered. On the other hand, excessive wetting time can result in intermetallic structures or large grain structures being formed in protective layer 224. This can then cause protective layer 224 to become brittle and weaker. In some embodiments, the wetting time can be between 10 seconds and 2 minutes, preferably between 30 seconds and 1 minute.

After wetting, protective layer 224 needs to cool down to below the melting point. A relatively rapid cooling down process can be needed to reduce the possibility of large grain structures being formed. In some embodiments, water-cooling or refrigerated-cooling can be included as part of the thermal reflow operation. After the thermal reflow, the thickness of protective layer 224 can be between 0.1 and 5 microns, preferably between 0.5 and 1 micron. Note that, after reflow, protective layer 224 needs to be sufficiently thick in order to provide adequate anti-corrosion protection to the underneath metallic (e.g., Cu) layer.

In FIG. 2M, the backside grid that comprises core layer 228 and protective layer 230 can be formed on top of thin metallic layer 226 using processes similar to the ones shown by FIGS. 2G-2J. If plating is used for depositions of core layer 228 and protective layer 230, the front side of the photovoltaic structure needs to be protected (e.g., by using photoresist).

FIG. 2N shows that thin metallic layer 226 can be selectively etched using a process similar to the one shown in FIG. 2K. As a result, TCO layer 212 can be partially exposed.

FIG. 2O shows that heat can be applied to protective layer 230, causing it to reflow to cover the sidewalls of core layer 228. The thermal reflow process of protective layer 230 can be similar to the one used in operation 2L.

In the example shown in FIGS. 2A-2O, the top and bottom metallic grids are formed one after the other, i.e., the top metallic grid is formed, including performing the thermal reflow, before metallic materials forming the bottom metallic grid are plated. In practice, it can also be possible to combine metallization processes on both sides of the photovoltaic structure. For example, it can be possible to simultaneously plating both sides of the photovoltaic structure. In addition, it can also be possible to perform thermal reflow on both sides of the photovoltaic structure. The fabrication throughput can be significantly improved if electrode grids on both sides of the photovoltaic structures can be formed simultaneously.

Figure 3A:
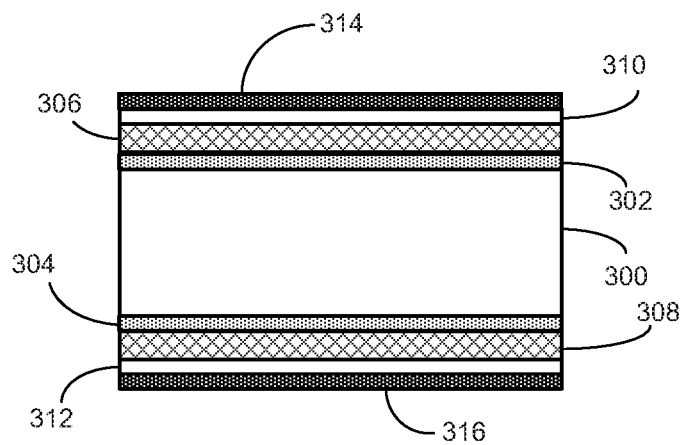
FIGS. 3A-3G show exemplary intermediate photovoltaic structures after certain fabrication steps, according to an embodiment of the present invention.

FIGS. 3A-3G show exemplary intermediate photovoltaic structures after certain fabrication steps, according to an embodiment of the present invention. FIG. 3A shows that a multilayer body of a photovoltaic structure. The multilayer body can be prepared using processes similar to those shown by FIGS. 2A-2F. The multilayer body can include base layer 300, tunneling/passivation layers 302 and 304, surface field layer 306, emitter layer 308, TCO layers 310 and 312, and Cu seed layers 314 and 316.

Figure 3B:
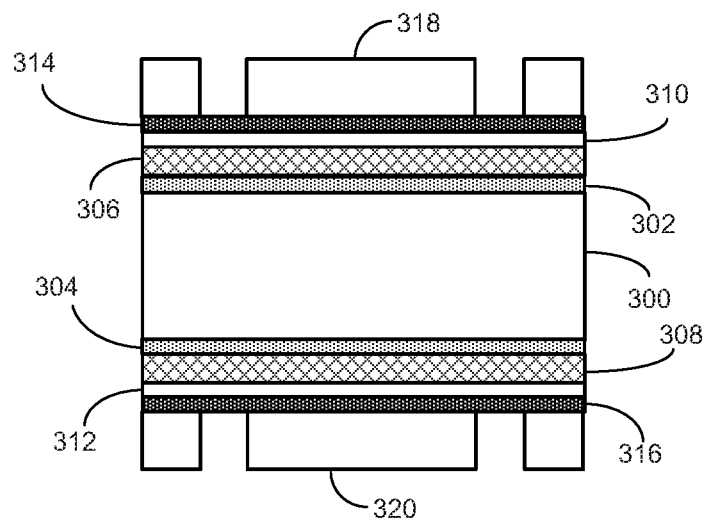

FIG. 3B shows that patterned photoresist masks 318 and 320 can be formed on Cu seed layers 314 and 316, respectively. Forming these two patterned masks can involve depositing and exposing photoresist on each side of the photovoltaic structure in sequence, and then simultaneously developing photoresist on both sides.

Figure 3C:
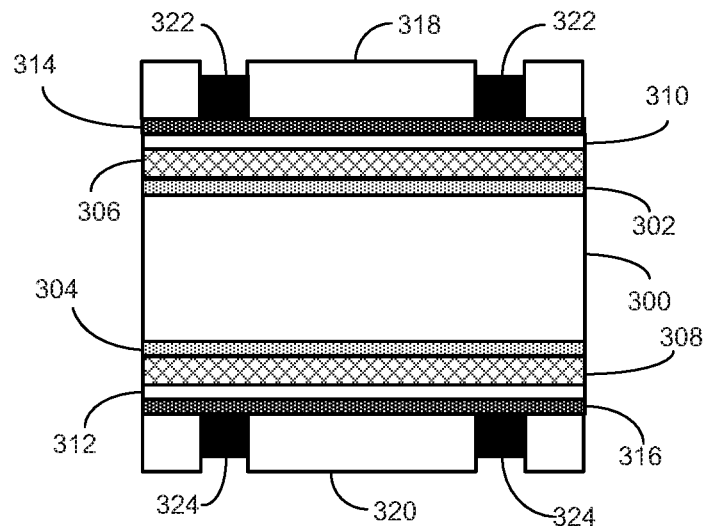

FIG. 3C shows that the photovoltaic structure can be submerged into an electrolyte solution suitable for Cu plating (e.g., $CuSO_4$) to simultaneously form Cu core layers 322 and 324 on metallic seed layers 314 and 316, respectively. Note that, because photoresist is electrically insulating, Cu ions can only be deposited at locations that correspond to windows of masks 318 and 320. During plating, Cu seed layers 314 and 316 both can be electrically coupled to the plating cathode.

Figure 3D:
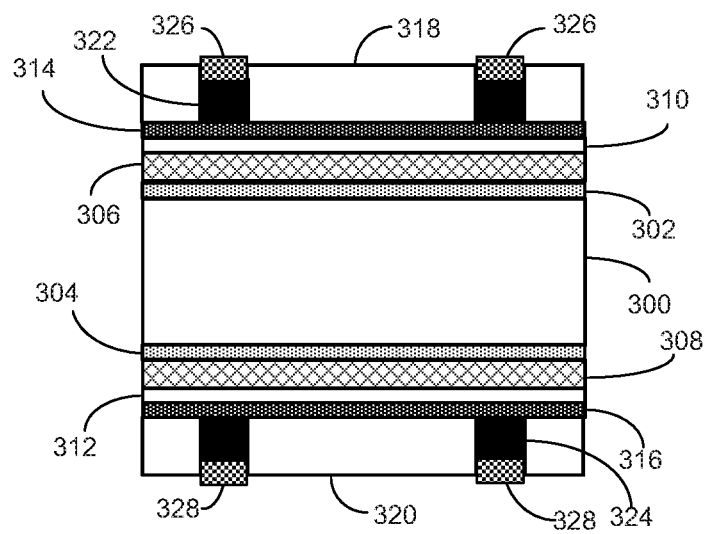

FIG. 3D shows that the photovoltaic structure can be submerged into an electrolyte solution suitable for tin plating (e.g., a solution containing $SnSO_4$) to simultaneously form tin layers 326 and 328 on Cu core layers 322 and 324, respectively.

Figure 3E:
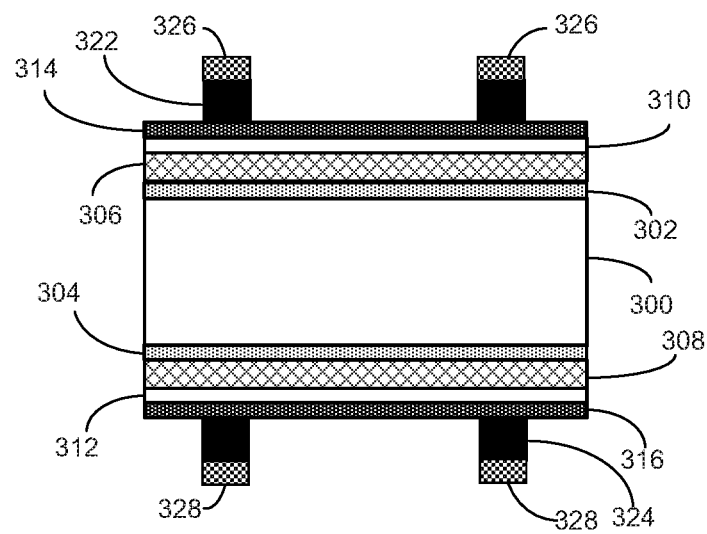

FIG. 3E shows that photoresist masks 318 and 320 can be removed simultaneously using a photoresist stripper, exposing the sidewalls of Cu core layers 322 and 324.

Figure 3F:
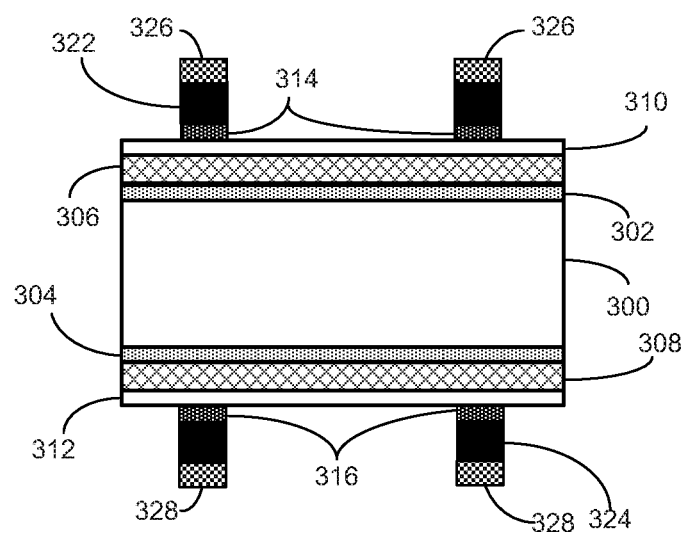

FIG. 3F shows that, using tin layers 326 and 328 as masks, Cu seed layers 314 and 316 can be selectively etched to expose TCO layers 310 and 312. If wet etching is used, Cu seed layers 314 and 316 can be etched simultaneously by submerging the photovoltaic structure into the etching solution.

Figure 3G:
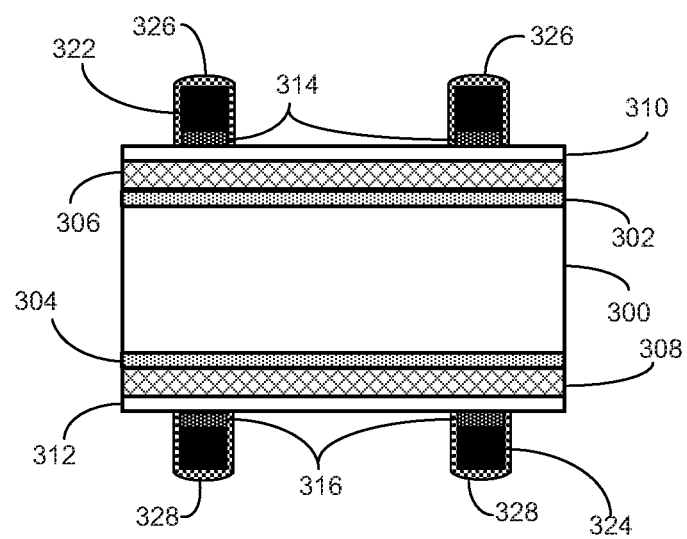

FIG. 3G shows that the photovoltaic structure can be heated to a temperature slightly above the melting point of tin (e.g., to about 240° C.), causing tin layers 326 and 328 to reflow to cover the sidewalls of Cu core layers 322 and 324. Cu seed layers 314 and 316 can also be buried by reflowed tin layers 326 and 328, respectively. To allow simultaneous reflow of both tin layers 326 and 328, the photovoltaic structure may need to be mounted onto a vertically oriented wafer carrier to ensure even heating to both surfaces. In cases where the heat is applied via radiation, heating elements may be arranged in a way such that both surfaces of the photovoltaic structures experience substantially even heating.

Fabrication System

Figure 4:
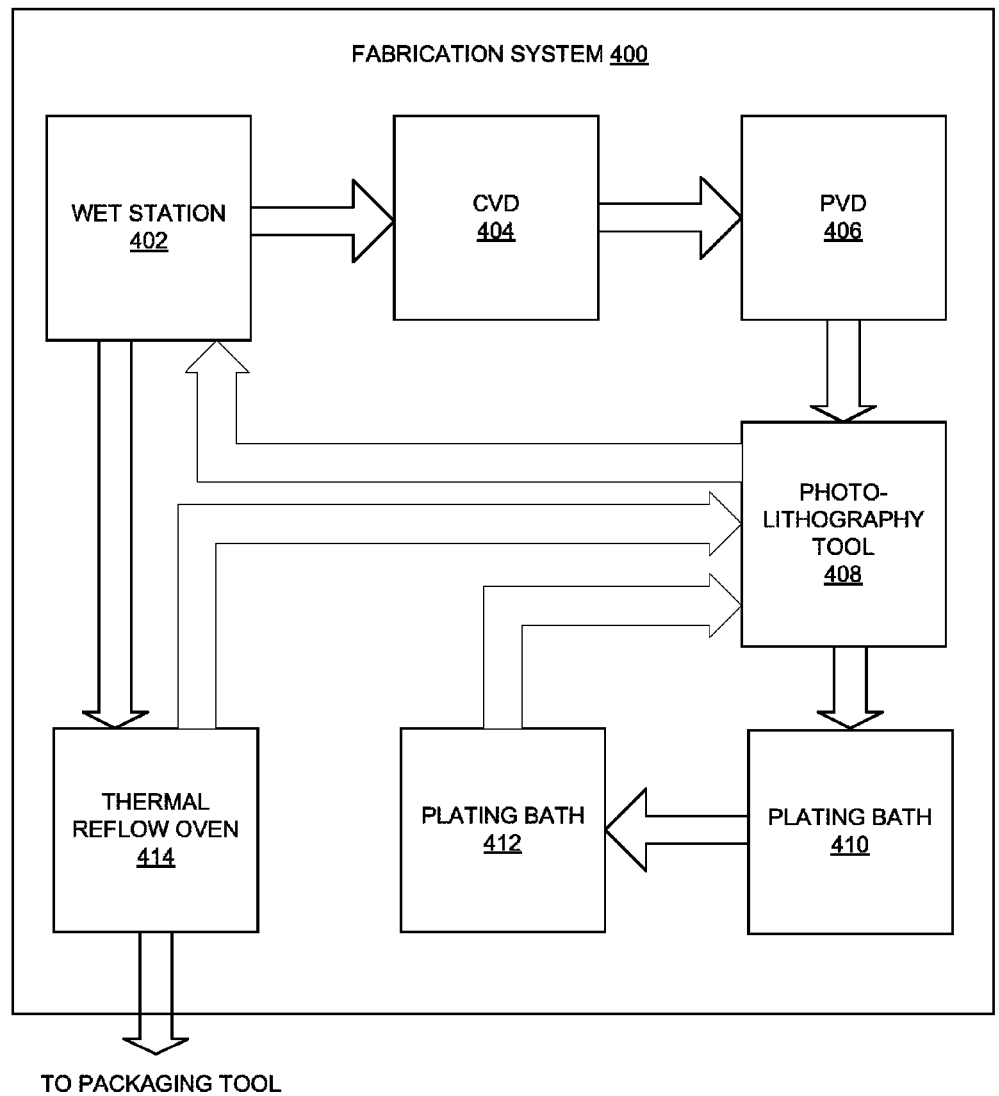
FIG. 4 shows an exemplary fabrication system, according to an embodiment of the present invention.

FIG. 4 shows an exemplary fabrication system, according to an embodiment of the present invention.

Fabrication system 400 can include wet station 402, CVD tool 404, PVD tool 406, photolithography tool 408, plating baths 410 and 412, and thermal reflow oven 414. Wet station 402 (also known as a wet bench) can include a number of baths, each containing a particular solution, used for the various wet processes (e.g., surface cleaning and texturing, wet oxidation, wet etching, etc). For large-scale fabrications, wet station 402 can process Si substrates in batches, with each batch including tens or hundreds of Si substrates. During fabrication, crystalline Si wafers can first undergo a number of wet processes at wet station 402, including surface cleaning, saw-damage removing, surface texturing, and wet oxidation.

The substrates emerging from wet station 402 can have a thin oxide layer formed on both surfaces, and can be sent to CVD tool 404 for material deposition. In some embodiments, CVD tool 404 can be used to deposit one or more passivation layer(s), an emitter layer, and a surface field layer. CVD tool 404 can be a combined CVD system that includes both static-processing CVD modules and inline-processing CVD modules. The static-processing modules can be used to deposit layers having higher surface quality requirements, and the inline-processing modules can be used to deposit layers having lower surface quality requirements. In some embodiments, photovoltaic structures may need to go through CVD tool two times to complete fabrications on both sides.

Photovoltaic structures emerging from CVD tool 404 can be transported, sometimes via an automated conveyor system, to PVD tool 406, which can be used to deposit a TCO layer and one or more thin metallic layers on each side of the photovoltaic structures. In some embodiments, PVD tool 406 can be configured to sequentially deposit a TCO layer and one or more thin metallic layers, without breaking vacuum. For example, PVD tool 406 can include a multiple-target sputtering tool (e.g., an RF magnetron sputtering tool). The multiple targets inside the deposition chamber can include an ITO target and one or more metallic targets. In some embodiments, a target can be a rotary target electrically coupled to a periodically tuned capacitor to ensure uniform target depletion. PVD tool 406 can also be configured to include a vertically oriented wafer carrier to enable simultaneous material deposition on both sides of the photovoltaic structures.

Photovoltaic structures emerging from PVD tool 406 can include a complete layer stack on both sides, and can be transported to photolithography tool 408. Optionally, before being sent to photolithography tool 408, the photovoltaic structures can go through a rapid annealing process at a temperature greater than 200° C. to anneal both the TCO and the one or more metallic layers. Photolithography tool 408 can deposit a patterned photoresist mask on one or both sides of the photovoltaic structures. The mask pattern can correspond to the pattern of a subsequently formed metallic grid, with windows in the mask corresponding to locations of the metal lines.

Plating baths 410 and 412 each can contain an electrolyte solution suitable for electroplating a certain metallic material. For example, plating bath 410 can be used to plate the core layer of a metallic grid, and plating bath 412 can be used to plate the protective layer of the metallic grid. The core layer of the metallic grid can include metallic materials with low resistivity, such as Cu. Accordingly, plating bath 410 can contain an electrolyte solution that includes Cu ions. The protective layer of the metallic grid can include corrosion-resisting, low melting point metallic materials, such as tin, tin-lead alloy, tin-zinc alloy, tin-bismuth alloy, tin-indium alloy, silver-lead alloy, tin-silver-copper alloy, tin-lead-zinc alloy, tin-lead-copper alloy, etc. Accordingly, plating bath 412 can contain an electrolyte solution that includes Sn ions and other appropriated metal ions. Photovoltaic structures with a patterned mask on one or both sides can be submerged into plating baths 410 and 412 sequentially, resulting in the sequential deposition of the core layer and the protective layer of a electrode grid on the one or both sides. To ensure high throughput, plating baths 410 and 412 can both be equipped with a cathode that can move from one end of a plating bath to the other end during plating; and photovoltaic structures can be attached to the moving cathode using custom designed jigs. The custom designed jig can establish electrical connections to both surfaces of the wafers, thus allowing simultaneous plating on both sides of the photovoltaic structures. It can also be possible to use to the same moving cathode in both plating baths, thus eliminating the need to unload and load the photovoltaic structures between plating operations.

Photovoltaic structures emerging from the plating baths can be sent back to photolithography tool 408 for the removal of the photoresist mask to expose the sidewalls of the core layer of the metallic grids. Alternatively, the removal of the photoresist mask can be performed at wet station 402. Afterwards, the photovoltaic structures can also be sent to wet station 402 for selective etching of the one or more thin metallic layers to expose the underneath TCO layer(s). Subsequent to the wet etching, the photovoltaic structures can be cleaned and dried before being sent to thermal reflow oven 414. Thermal reflow oven 414 can include a conveyor system (e.g., a conveyor belt) and a number of heating/cooling zones. Photovoltaic structures can be loaded onto the conveyor and move through the different heating/cooling zones. When the protective layer of the metallic grid reaches its melting point, it can reflow to cover the sidewalls of the core layer. The thermal profile of the protective layer can be controlled by adjusting the temperature setting in each heating/cooling zone and the speed of the conveyor. The fabrication of the metallic grid can be completed once the photovoltaic structures are sufficiently cooled and the protective layer re-solidified. If metallic grids on both sides are completed, the photovoltaic structures can be sent to a packaging tool, which can divide the standard photovoltaic structures into smaller strips, cascading the smaller strips into strings, and placing the strings into a protective frame to obtain a solar panel. If only one side of the photovoltaic structures has a completed metallic grid, the photovoltaic structures can be sent back to photolithography tool 408 to continue the fabrication of a metallic grid on the other side.

Variations to the fabrication system shown in FIG. 4 are also possible. For example, an alternative fabrication system may have two CVD tools to allow material depositions on different sides of the photovoltaic structures to be performed in different CVD tools. This way, the photovoltaic structures do not need to go through the same CVD tool twice, thus reducing the wait time and further increasing the fabrication throughput. The fabrication system can also include one or more annealing stations that can anneal the TCO layers and/or the metallic seed layers. In addition to using a plating bath, the protective layer can also be deposited using a PVD tool, which can be the same PVD tool used for the TCO and/or metallic seed layer deposition or a different PVD tool.

The foregoing descriptions of various embodiments have been presented only for purposes of illustration and description. They are not intended to be exhaustive or to limit the invention to the forms disclosed. Accordingly, many modifications and variations will be apparent to practitioners skilled in the art. Additionally, the above disclosure is not intended to limit the invention.

What is claimed is:

1. A method for fabricating a photovoltaic structure by forming a first grid on a first surface of a multilayer body of the photovoltaic structure, the method comprising:
   forming a patterned mask on the first surface of the multilayer body, wherein openings of the patterned mask correspond to grid line locations of the first grid;
   depositing, using a plating technique, a core layer of the first grid in the openings of the patterned mask;

depositing, using a plating technique, a protective layer on an exposed surface of the core layer while the patterned mask is covering sidewalls of the core layer;

removing the patterned mask to expose the sidewalls of the core layer; and applying heat to the protective layer such that the protective layer reflows to cover both the exposed surface and sidewalls of the core layer.

2. The method of claim 1, wherein the patterned mask includes a photoresist mask or a $SiO_2$ mask.

3. The method of claim 1, wherein the core layer includes a metallic layer comprising Cu.

4. The method of claim 1, wherein a thickness of the core layer is be between 10 and 100 microns.

5. The method of claim 1, wherein the protective layer includes one or more metallic materials selected from a group consisting of:

tin;
tin-lead alloy;
tin-zinc alloy;
tin-bismuth alloy;
tin-indium alloy;
tin-silver-copper alloy;
tin-lead-zinc alloy; and
tin-lead-copper alloy.

6. The method of claim 5, wherein the protective layer includes one or more of:

tin; and
tin-lead alloy.

7. The method of claim 1, wherein a thickness of the protective layer, before the protective layer reflows, is between 0.3 and 10 microns.

8. The method of claim 1, wherein a thickness of the protective layer, after the protective layer reflows, is between 0.1 and 5 microns.

9. The method of claim 1, wherein the multilayer body comprises at least:

a base layer;
an emitter layer positioned on a first side of the base layer; and
a surface field layer positioned on a second side of the base layer.

10. The method of claim 9, wherein the multilayer body further comprises:

a passivation layer positioned between the base layer and the emitter layer;
a second passivation layer positioned between the base layer and the surface field layer;
a transparent conductive oxide layer positioned on the emitter layer; and
a second transparent conductive oxide layer positioned on the surface field layer.

11. The method of claim 1, further comprising:

forming a second grid on a second surface of the multilayer body simultaneously with the first grid.

* * * * *